United States Patent
Azimi et al.

[11] Patent Number: 6,163,183
[45] Date of Patent: Dec. 19, 2000

[54] MULTIFUNCTION RESET FOR MIXED-SIGNAL INTEGRATED CIRCUITS

[75] Inventors: Kouros Azimi, West Chester; Zhigang Ma, Bethlehem; Dale H. Nelson, Shillington, all of Pa.; Brian J. Petryna, Lebanon, N.J.; Oceager P. Yee, Allentown, Pa.

[73] Assignee: Lucent Technologies, Inc, Murray Hill, N.J.

[21] Appl. No.: 09/356,043

[22] Filed: Jul. 16, 1999

[51] Int. Cl.[7] .................................................. H03L 7/00
[52] U.S. Cl. ........................ 327/142; 327/143; 327/63; 327/74; 327/205
[58] Field of Search .................................. 327/63, 64, 65, 327/68, 69, 70, 72, 77, 82, 142, 143, 198, 205, 206, 74

[56] References Cited

U.S. PATENT DOCUMENTS

| | | | |
|---|---|---|---|
| 3,990,048 | 11/1976 | Kanitz et al. | 327/74 |
| 4,047,056 | 9/1977 | Nakagawa | 327/101 |
| 4,572,966 | 2/1986 | Hepworth | 327/143 |
| 5,850,156 | 12/1998 | Wittman | 327/143 |
| 5,910,739 | 6/1999 | Stanojevic | 327/143 |

*Primary Examiner*—Timothy P. Callahan
*Assistant Examiner*—An T. Luu

[57] ABSTRACT

A multifunction reset circuit including low power bandgap, a comparator, and an open drain buffer circuit—with the inclusion of four external components (three resistors and one capacitor) to provide undervoltage monitoring, power failure indicating, manual resetting and other reset control conditions to a single integrated circuit terminal, together with hysteresis tolerance.

7 Claims, 2 Drawing Sheets

MULTIFUNCTION RESET FOR MIXED-SIGNAL INTEGRATED CIRCUITS

BACKGROUND OF THE INVENTION

1. Field of the Invention

This invention relates to microprocessor supervisory circuits, in general, and to the resetting of their digital signal processors, in particular.

2. Description of the Related Art

As is known, microprocessor supervisory circuits require algorithm and software resetting after conditions of power failure recovery. For such circuits in corded and cordless telephones and answering system telephones, other resets (for example, to limit the garbling of recorded messages or only the partial retrieval of voice-mail information) are also required in circumstances where battery supply and other voltages are monitored to gauge operating performance—and on such occasions as when a cordless phone's power jack is initially connected to a wall outlet, or when the phone is connected to a wall jack, or when the answering machine is simply turned on for use. These and other arrangements traditionally require dedication of many terminals and circuit pins on the digital signal processor's integrated chip. As is understood, this leads to higher costs of manufacture, and an ever increasing dissipation of power due to the redundancy of the various controls implemented.

SUMMARY OF THE INVENTION

As will become clear from the following description, with the present invention on the other hand, only two pins are needed in the digital signal processor in order to carry out the varied and different resets that are typically required. Although operable to provide a reset for the integrated circuit for a wide variety of conditions, the specific embodiments of the invention to be described are especially useful as a power fail mechanism, in battery monitoring, in the presence of manual reset initiation, and during "watchdog" timer monitoring for predetermined periods of information lull.

With the preferred embodiment of the multifunction reset circuit to be described, a low power bandgap, a comparator, and a microelectric open-drain buffer circuit are utilized. With the addition of four external components (three resistors and one capacitor), undervoltage monitoring and power fail indication is afforded, along with hysteresis control. In this embodiment, the comparator has its output coupled to an input of the open-drain buffer circuit, with a low power bandgap providing a reference voltage to a first input of the comparator (i.e. its negative terminal). Hysteresis control is implemented through the use of a first resistor coupled between a second input of the comparator (i.e. its positive terminal) and an output of the open-drain buffer circuit—with the undervoltage monitoring and power failure indication being provided by the second and third resistors coupled as a divider in providing a variable voltage to the second input of the comparator. With the various reset condition control signals for the digital signal processor being applied to the input of the open-drain buffer circuit, its output serves as the single reset control terminal needed. When using an MOS field-effect transistor in the open-drain buffer circuit, for example, its gate and drain electrodes will then be understood to serve as the input and output of the buffer circuit respectively. With the capacitor coupled across the third resistor, and momentarily switchable across it, manual resetting of the digital signal processor can be had, in addition to the automatic resetting needed to insure optimum performance in the telephone mode. Lower cost will be seen to follow, with only a pair of pins thus being required to act as the varied reset mechanisms for the integrated circuit employed.

BRIEF DESCRIPTION OF THE DRAWINGS

These and other features of the present invention will be more clearly understood from a consideration of the following description, taken in connection with the accompanying drawings, in which.

DETAILED DESCRIPTION OF THE INVENTION

Figure 1:
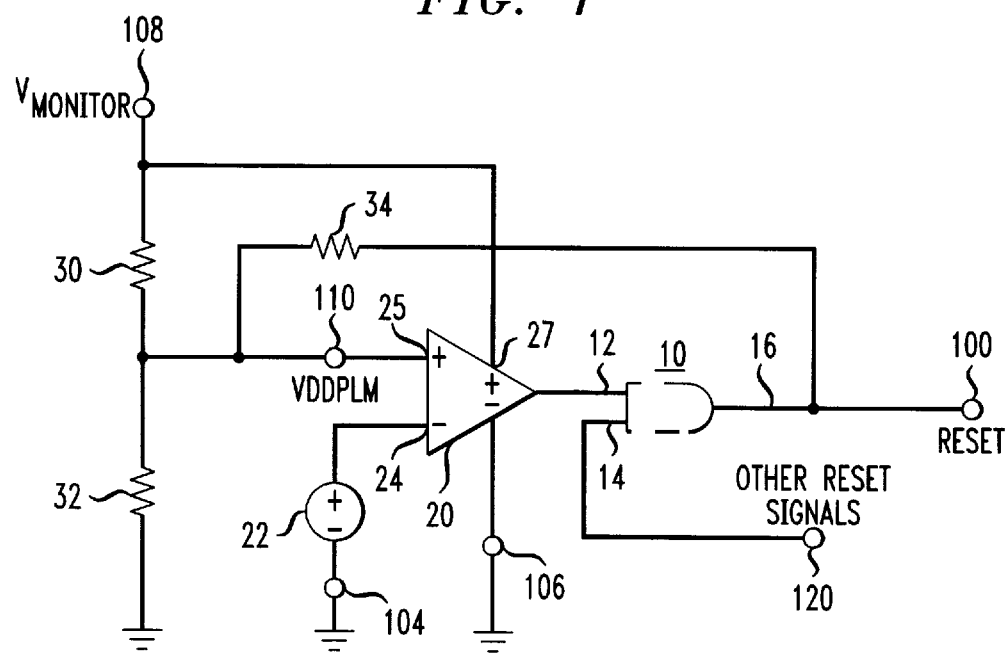
FIG. 1 is a schematic diagram, partially in block form, illustrating the reset mechanism of the invention in the event of power failure at the integrated circuit digital signal processor.
Figure 2:
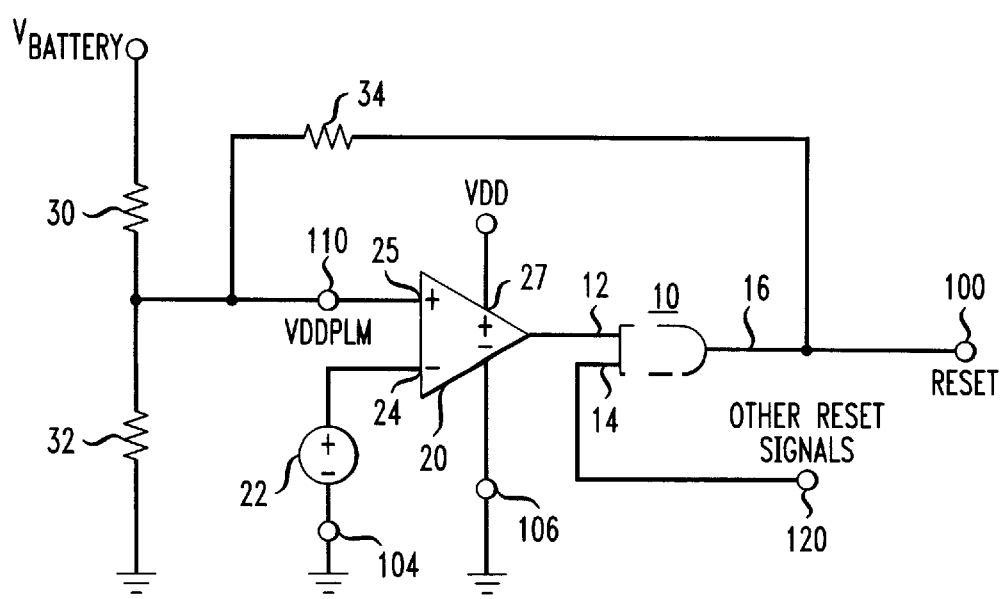
FIG. 2 is a similar schematic diagram to illustrate the reset function as utilized in conjunction with battery, or other external voltage source, monitoring.
Figure 3:
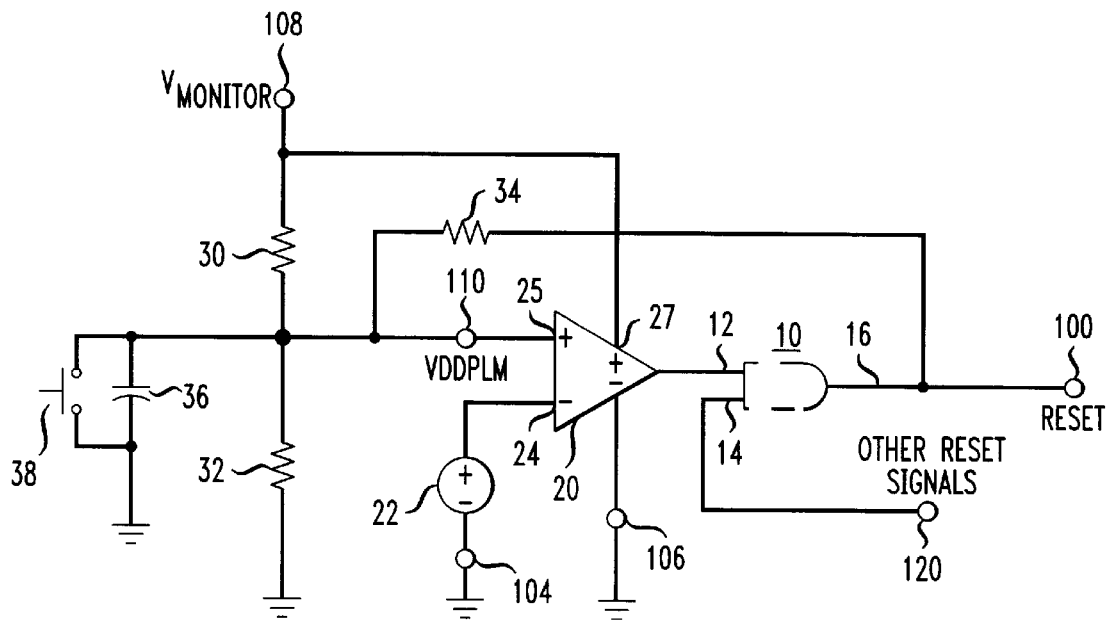
FIG. 3 is a schematic diagram helpful in an understanding of the manual reset mechanism afforded by the invention.

In FIGS. 1–3, an open-drain buffer circuit 10 is schematically illustrated for providing a reset control signal for a digital signal processor of a corded, or cordless answering system telephone, as at terminal 100. When including an MOS field-effect transistor, for example (see FIG. 4), the terminal 100—typically existing as a pin on an integrated circuit chip—may be coupled to the drain electrode of an MOS device as an output 16 of the open-drain buffer circuit 10. As will be appreciated, when an open-drain buffer circuit is used, various reset signals may be combined to obtain a system reset functionality. In such manner, any one reset signal applied at input 14 will cause the system to reset.

Also included on the integrated circuit chip as commonly employed in the digital signal processor is a comparator 20 and a low power bandgap reference voltage 22. As shown in FIGS. 1–3, the low power bandgap is coupled between a reference electrode 24 on the comparator 20, and a further terminal pin 104 traditionally coupled to ground. As also shown, the output of the comparator 20 is coupled to a second input 12 of the open-drain buffer circuit 10. As will be appreciated by those skilled in the art, other pins are conventionally provided on the integrated chip, and coupled to various component locations on the integrated device. Besides the terminals 100 and 104, a further terminal 106 is provided for the comparator 20, which is likewise externally connected to ground. Control signals developed at terminal 100 typically afford reset of the algorithm and software within the digital signal processor under such circumstances as when the cordless phone's power jack is initially connected to a wall outlet and when the answering machine function is turned on for use—and for such other occasions as to limit partial retrieval of voice-mail information, to limit garbling of recorded messages, and for other such instances.

A further terminal 110 is additionally provided, according to the invention, for use in resetting the digital signal processor, as a manner of detecting power failure, in battery monitoring, and in the presence of manual reset initiations. "Watchdog" timer monitoring in this utilization will be appreciated to be applied by way of the terminal 120 coupled to the input 14 of the open-drain buffer circuit 10.

In accordance with the invention, the two terminals 100 and 110—the only pins needed for system reset functionality—are made available to use in coupling with four external components to be added—in particular, the resistors 30, 32 and 34 and a capacitor 36, together with a momentary switch 38.

Resistors 30 and 32 are connected externally to the integrated chip, as part of a resistive divider connected between ground and some voltage $V_{monitor}$ in a corded telephone (FIGS. 1 and 3), or across a fixed supply $V_{battery}$ (FIG. 2), with the join between the two resistors being coupled by the terminal 110 to the second input 25 of the comparator 20. Between this terminal 110 and the chip's output terminal 100, the third resistor 34 is externally coupled, for providing hysteresis control. In FIGS. 1 and 3, the terminal 108 is coupled to the comparator control 27, whereas in FIG. 2, some other direct voltage exists at the terminal 27 as a stepdown from the battery power.

Considering, first, the power fail mechanism attainable with the corded configuration of FIG. 1, its operation proceeds with the bandgap circuit 22 establishing a reference voltage at the negative terminal 24 of the comparator 20. The voltage at the positive terminal 25 is then compared to such internal reference. When the voltage at terminal 110 falls below the reference voltage from the bandgap 22, the output of the comparator 20 goes low to input 12 of the open-drain buffer circuit 10, and a reset signal is developed at terminal 100. When the power is restored such that the voltage at terminal 110 rises above the reference voltage, the output from the comparator 20 goes high, and normal operation resumes.

FIG. 2, on the other hand, represents the control for battery monitoring in a cordless phone. In particular, a reset at terminal 100 develops when the battery voltage falls below a "trip" level. This similarly occurs when the voltage at terminal 110 falls below the reference voltage at the comparator input 24. Because a voltage divider network is used, the maximum allowable voltage at terminal 25 of the comparator 20 is dictated by the composition of the integrated device, such that when the voltage at terminal 110 rises to the recovery level, the output of the comparator 20 goes high, and the circuit resumes operation. Resistor 34, in this and the configurations of FIGS. 1 and 3, provides a hysteresis tolerance control to the comparator.

In manual resetting of the corded or cordless answering system telephone, the configuration of FIG. 3 comes into play. There, temporarily grounding the terminal 110 causes the reset to issue at terminal 100 by externally toggling the mechanical switch 38, or by an electronic switch if one is utilized instead. For "Watchdog" timer mechanism operation, the internal timing circuitry of the integrated chip will be understood to issue the appropriate reset at terminal 100 when the circuitry is not toggled within the predetermined time period set. The output of the "Watchdog" timer circuitry will be appreciated to be tied to the open-drain buffer circuit 10, as by application through a control terminal 120 to the input 14.

In carrying out the functions of reset with the arrangements schematically shown in FIGS. 1–3, it will be understood that when employing an MOS transistor in the open-drain buffer circuit 10, the output terminal 100 conventionally incorporates, also, some external pull-up resistor and capacitor to provide a long-enough reset to serve as the required command for the digital signal processor. Although such components are also "external" to the integrated chip, they will be understood to be there for a purpose other than the undervoltage monitoring and power failure indication afforded by the present invention with its manual resetting available with the present invention through the incorporation of the two terminals 100 and 110, it being appreciated that the terminal 100 already exists as a pin as part of the integrated fabrication. Recognizing that the control signals at terminal 120 are already present within the integrated circuit, all that is additionally required with the invention is the providing of terminal 110 as a second pin so that the external resistive and capacitive components can be connected.

Figure 4:
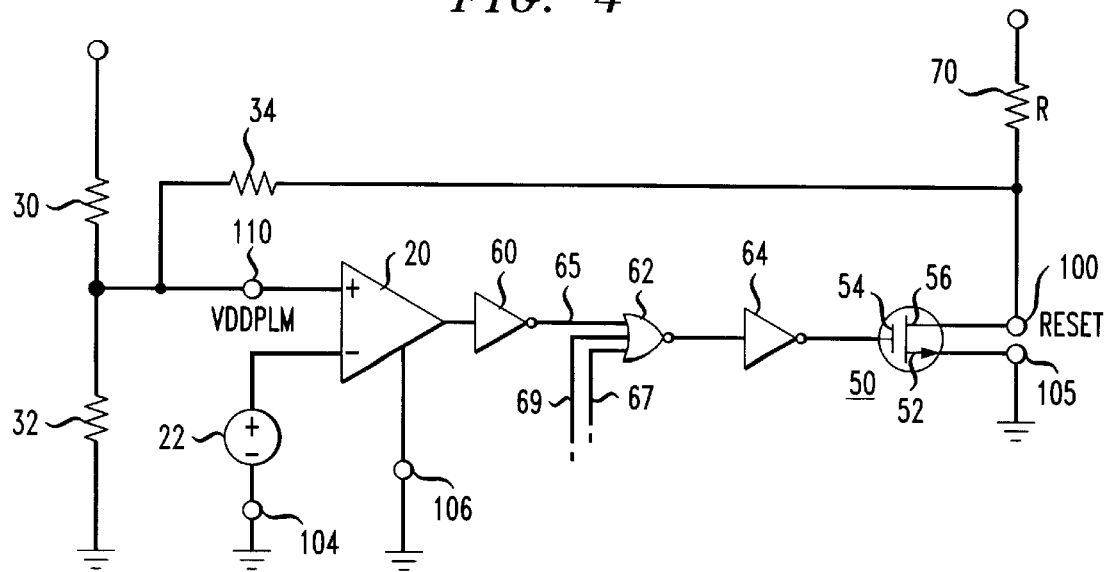
FIG. 4 is a simplified, partial schematic diagram helpful in an understanding of the construction of the open-drain buffer circuit of the invention.

FIG. 4 schematically illustrates the open-drain buffer circuit 10 as it might be constructed employing an MOS field effect transistor 50, whose source electrode 52 is connected to ground at terminal 105. The output of the comparator 20 is coupled by way of a inverter 60, a NOR circuit 62 and a further inverter 64 to the gate electrode 54 of the transistor 50, whose drain electrode 56 is shown as being connected to the terminal 100, where a pull-up resistor 70 is connected. The NOR circuit 62 is illustratively shown as having three inputs 65, 67, 69 (coupled to respectively receive the output of inverter 60, the "Watchdog" timer monitoring control, and any other system reset controls utilized in the hardware design), and with its output coupled directly to the input of the inverter 64. As with the generic circuits of FIGS. 1–3, system reset functionality occurs with the addition of only the circuit pins 100 and 110.

While there have been described what are considered to be preferred embodiments of the present invention, it will be readily appreciated by those skilled in the art that modifications can be made without departing from the scope of the teachings herein, which allow for the utilization of only two integrated circuit pins to accomplish the reset function, the use of external components to reduce integrated circuit power consumption, and the reduction in integrated circuit die size which follows from the use of these external components. For at least such reasons, therefore, resort should be had to the claims appended hereto for a true understanding of the scope of the invention.

We claim:

1. A multifunction reset for a mixed-signal integrated circuit comprising:

a microelectronic open-drain buffer circuit;

a comparator having an output coupled to a first input of said buffer circuit;

a low power bandgap providing a reference voltage to a first input of said comparator;

a first resistor coupled between a second input of said comparator and an output of said buffer circuit; and second and third resistors coupled as a divider providing a variable voltage to said second input of said comparator;

whereby said output of said buffer circuit serves as a reset control terminal for said integrated circuit.

2. The multifunction reset of claim 1, also including a source of varied reset condition control signals for said integrated circuit coupled to a second input of said buffer circuit, and whereby said output of said buffer circuit serves as a single reset control terminal for said integrated circuit for each said reset condition.

3. The multifunction reset of claim 2, additionally including a capacitor coupled across said third resistor.

4. The multifunction reset of claim 3, further including a momentary switch coupled across said capacitor.

5. The multifunction reset of claim 4, wherein said momentary switch is mechanically operable.

6. The multifunction reset of claim 2, wherein said second and third resistors are coupled to divide a source of battery power within said integrated circuit.

7. The multifunction reset of claim 2, wherein said second and third resistors are coupled to divide a direct voltage monitored at a point within said integrated circuit.

* * * * *